United States Patent
Hodges et al.

(10) Patent No.: US 11,104,993 B2
(45) Date of Patent: Aug. 31, 2021

(54) MODULAR TRAY AMPOULE

(71) Applicant: Entegris, Inc., Billerica, MA (US)

(72) Inventors: Jordan Hodges, Cedar Park, TX (US);
Jacob Thomas, Leander, TX (US)

(73) Assignee: ENTEGRIS, INC., Billerica, MA (US)

( * ) Notice: Subject to any disclaimer, the term of this patent is extended or adjusted under 35 U.S.C. 154(b) by 275 days.

(21) Appl. No.: 16/044,861

(22) Filed: Jul. 25, 2018

(65) Prior Publication Data

US 2019/0032206 A1 Jan. 31, 2019

Related U.S. Application Data

(60) Provisional application No. 62/538,118, filed on Jul. 28, 2017.

(51) Int. Cl.
*C23C 16/448* (2006.01)
*C23C 16/455* (2006.01)
*C23C 16/08* (2006.01)
*C23C 16/18* (2006.01)

(52) U.S. Cl.
CPC .... *C23C 16/4483* (2013.01); *C23C 16/45544* (2013.01); *C23C 16/08* (2013.01); *C23C 16/18* (2013.01)

(58) Field of Classification Search
CPC .......... C23C 16/45544; C23C 16/4483; C23C 16/45584
USPC .......................................................... 118/726
See application file for complete search history.

(56) References Cited

U.S. PATENT DOCUMENTS

| | | | |
|---|---|---|---|
| 8,821,640 B2 | 9/2014 | Cleary et al. | |
| 2004/0016404 A1* | 1/2004 | Gregg | F17C 11/00 118/726 |
| 2008/0057218 A1* | 3/2008 | Gregg | C23C 16/4481 427/523 |

FOREIGN PATENT DOCUMENTS

| | | | |
|---|---|---|---|
| WO | WO 2015/127092 | * | 8/2015 |
| WO | 2015/164029 | | 10/2015 |

* cited by examiner

*Primary Examiner* — Elizabeth A Burkhart
(74) *Attorney, Agent, or Firm* — Entegris, Inc.

(57) ABSTRACT

The invention is directed to a configurable vaporizer or ampoule assembly that uses a configurable vessel body, assembled from one or more support tray modules with their own individual heating assemblies or heater members, bounded by a base member and a lid member to form the whole ampoule. This eliminates the need for the prior art ampoule body that normally holds the support trays and was used to heat each of the support trays from the exterior surface using heating jackets or the like.

20 Claims, 5 Drawing Sheets

MODULAR TRAY AMPOULE

CROSS-REFERENCE TO RELATED APPLICATIONS

This application claims the benefit under 35 USC 119 of U.S. Provisional Patent Application No. 62/538,118, filed Jul. 28, 2017, the disclosure of which is hereby incorporated herein by reference in its entirety for all purposes.

FIELD OF INVENTION AND BACKGROUND

The present disclosure relates to vaporizers useful in volatilizing solid precursors to provide precursor vapor to a precursor vapor-utilizing process system such as a vapor deposition chamber or an ion implanter for manufacturing of semiconductor products, flat-panel displays, solar panels, and the like.

In the use of solid-phase precursors to supply precursor vapor for vapor-utilizing applications, a wide variety of vaporizers have come into use. Such vaporizers may comprise a vessel and cover defining an enclosed interior volume in which a solid phase precursor may be stored and subsequently subjected to volatilization conditions to effect sublimation or vaporization of the solid phase precursor to produce precursor vapor. For such purpose, the vessel may be fabricated of a heat-conductive material and heated to cause the volatilization of the precursor and/or a heated carrier gas may be flowed through the vessel to create a mass transfer gradient resulting in entrainment of precursor vapor from the solid source precursor material.

A wide variety of vaporizers has been developed, and efforts are continuing to evolve new designs that maximize the efficiency of solid precursor volatilization, resist clogging incident to precursor vapor condensation and re-solidification, minimize energy input that is necessary to dispense a given quantity of precursor vapor, and that otherwise afford advantages over existing vaporizers. In some installations, vaporizer vessels are mounted in difficult to access locations for replenishing precursor material within the vessel (or located within one or more precursor material support trays disposed within the vessel shell or body) or for conducting repairs of the vessel body or for changing the configuration of the vessel and/or associated support trays for another vaporization process. Hence, compact vaporizer designs or easily accessible vaporizer vessels in current semiconductor manufacturing installations would be advantageous.

SUMMARY

New technology applications have increased the amount of solid chemistries being used in wafer manufacturing and have increased the amount of consumption. Increased customer activity has identified shortfalls in the current vaporizer designs. It would be advantageous to have a precursor vaporization system that includes a vaporizer vessel that is easily accessible and potentially configurable for installation in current manufacturing and semiconductor processing systems.

The current vaporizer vessel designs have manufacturing and ongoing service issues despite being commercially successful products. The current vaporizers can be costly to build and may be challenging to assemble outside of a vendor's manufacturing facility. In some cases, the vaporizer design itself can be rigid and may not lend itself to application specific changes or modifications requested by a customer. If a customer requires some level of customization, such as a new valve, a different vaporizer vessel height, or a different precursor material fill amount, costly changes may have to be made by engineering and manufacturing to fulfill these requests. Such requests can contribute to long lead times in an industry where timing is everything. Customers ordering an ampoule or vaporizer vessel that can fit their existing capital equipment or wanting to change ampoule vendors may be limited by their current installation layout. This can translate to strict requirements around ampoule height, inlet or outlet valve type, inlet and outlet port spacing, and interfacing with an ampoule heater. Heaters are required for the ampoule to sublimate the solid so it can be delivered to the semiconductor manufacturing process in a gaseous state. Heaters are typically in the form of a heating jacket or an oven that surrounds the ampoule, hence the need to accurately and consistently apply the correct amount of heat to sublimate the precursor material within the ampoule.

The various embodiments of ampoule designs provided herein introduce an aspect of design flexibility that will allow the ampoule to be retrofitted into existing semiconductor processing facilities and to be custom designed for new semiconductor manufacturing installations that need space or component location flexibility. The novel modular tray and completed ampoule vessel assembly has various novel features including an embedded heating assembly or heater (within each tray module) and configurable base and lid members for varying the size of the ampoule assembly and the varying the ampoule's inlet and outlet port locations and configurations. With respect to the embedded heating assembly in each ampoule tray, evenly and consistently applying heat to the ampoule assembly as a whole and to each precursor material support tray is critical and must be an efficient process. Current designs rely on convection ovens or heating blankets which have inherent problems and can present heating uniformity challenges due to the multiple components (vessel body, base and lid members, each support tray within the vessel body, etc.). Understanding the ampoule's overall response to heat inputs is another situation that customers spend significant time on. Therefore, allowing the new ampoule assembly to serve as the heat source will increase operational efficiency and remove other variables that lead to inconsistency in ampoule output. Individual trays can now be cast in stainless steel (SST) or in aluminum and can be cast with heating elements into these metals. In a related embodiment, enclosed or encased channels are formed with the cast metal so as to direct a heated liquid or steam therethrough and heat each individual modular support tray. Using a metal cast approach greatly reduces manufacturing cost and allows flexibility around materials of construction. The choice given an end user between SST or aluminum materials of ampoule construction (but not necessarily limited to such materials) will depend upon the desired process chemistry or maximum allowed ampoule weight for a particular processing installation.

The various embodiments disclosed herein also provide a modular design for an ampoule vessel that solves several challenges faced by users of traditional or standard ampoules. As a building block or component to the novel modular ampoule vessel assembly there is provided at least one identical precursor material support tray that not only serves as its own heat source (as described above) but also is constructed to allow each of the support trays to index and stack on top of each other regardless of the amount of trays needed for a particular application. Each of these support trays will also include an O-ring groove (and O-ring) so each individual tray can be sealed in an assembly or by itself (bounded by a lid and a base member or module). The various tray modules are paired with a lid module and a base module. For most applications, the base module should cap the bottom the ampoule vessel assembly. Depending on application, several different base modules are provided to vary the heating set up or to change the geometry and resulting gas flow. The lid module is configurable so as to lend itself to a high level of customization and allows for different lid module configurations to be created quickly by the user. This feature provides the user design flexibility in making valve configurations and port spacing minor changes to the overall ampoule design. The novel modular ampoule vessel assembly solves many of the installation and maintenance issues facing standard ampoules. Issues with support trays fitting into a base shell or housing are resolved since the trays are now self-contained and actually are the building blocks or components to the ampoule vessel itself hence there is no longer a need for a vessel body or base shell as in standard ampoule vessels. Application of heat on the precursor material is now easier and more efficient with individually embedded heating elements in each support tray, thereby eliminating the need for need for a heating jacket or convection ovens that surround the ampoule vessel. Specific customer applications can now be addressed with the high level of configurability provided by the modular tray approach. Valve set and port spacing requirements are achievable through physical modifications to the lid module without affecting the rest of the ampoule design. Individual customer height and material fill requirements are achievable through a different number of support trays, different base dimensions and different lid configurations and in some cases are actually implemented on the customer's site. Consistency in the trays and an overall consistent ampoule assembly method will improve the speed and quality of manufacturing while reducing cost and ensuring continuity of supply.

The novel features of the various embodiments the invention itself, both as to its construction and its method of operation, together with additional advantages thereof, will be best understood from the following description of specific embodiments when read in connection with the accompanying drawings.

DESCRIPTION OF THE PREFERRED EMBODIMENTS

Following are more detailed descriptions of various related concepts related to, and embodiments of, methods and apparatus according to the present disclosure. It should be appreciated that various aspects of the subject matter introduced above and discussed in greater detail below may be implemented in any of numerous ways, as the subject matter is not limited to any particular manner of implementation. Examples of specific implementations and applications are provided primarily for illustrative purposes.

Figure 1:
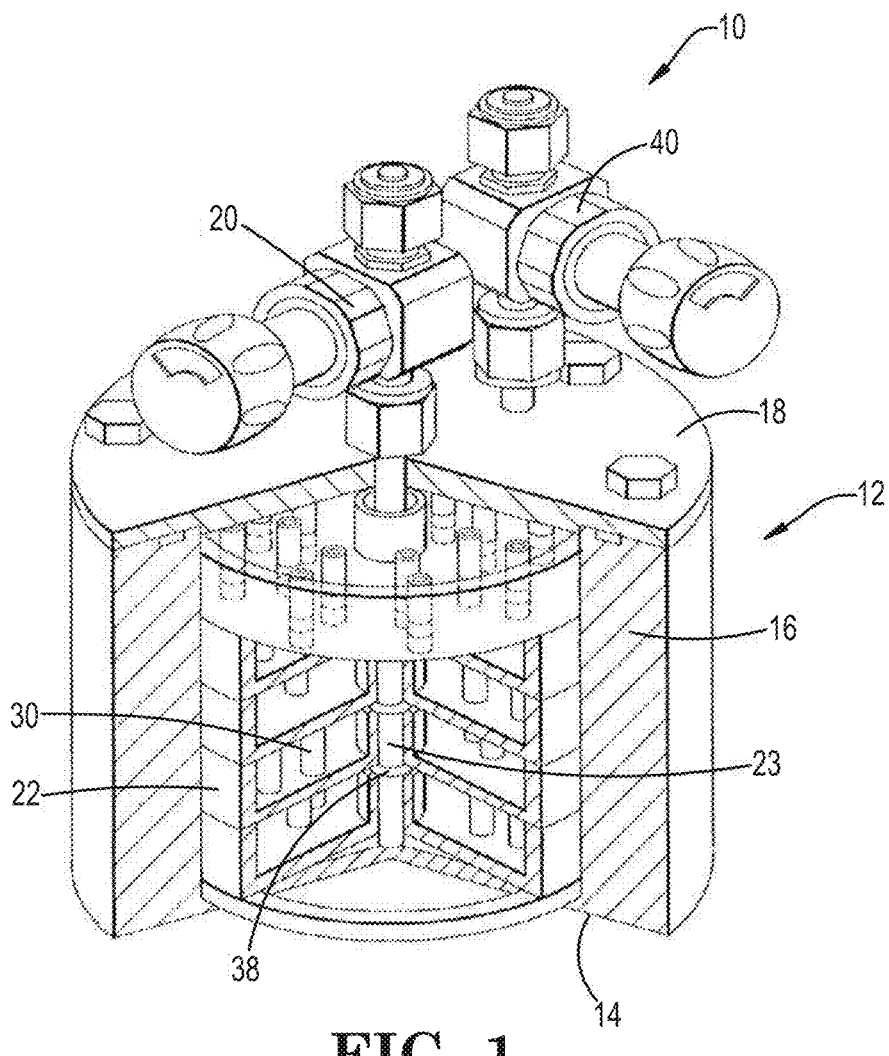
FIG. 1 illustrates a prior art vaporizer vessel including an outer shell body enclosing one or more support trays.

Referring to the Figures, FIG. 1 is perspective view of a prior art vaporizer 10 of a general type. The vaporizer 10 comprises a vessel body 12 fabricated of a suitable heat-conducting material. Vessel body 12 comprises a floor 14 and circumscribing sidewall 16 that together form an interior volume of the vessel. Vessel body 12 can have any shape that facilitates an even flow of carrier gas through the interior volume thereof. In one embodiment, the vessel has a cylindrical shape machined to very close tolerances (e.g., in a range of $\frac{1}{1000}$* to $\frac{3}{1000}$* of an inch (25.4 μm to 76.2 μm). The vessel includes a lid 18 on which is mounted a carrier gas inlet valve 20 arranged to selectively introduce carrier gas into the interior volume of the vessel, when the valve is open, and a gas outlet valve 40 for dispensing of the vaporized material from the vaporizer vessel. Vaporizer vessel body 12 can be constructed from materials including stainless steel, graphite, silver, silver alloy, copper, copper alloy, aluminum, aluminum alloy, lead, nickel clad, silicon carbide coated graphite, boron nitride, ceramic material, etc., as well as combinations, mixtures and alloys of two or more of such types of material.

Positioned in the internal volume of vessel body 12 is a plurality of vertically stacked support trays 22. The stacked support trays are separable from each other and removable from the vessel body for cleaning and refilling. Positioned within the vessel body is an internal central carrier gas downtube 23 that is connected (welded) to a gas inlet in the lid associated with inlet valve 20 and conveys the carrier gas to the bottom of the internal volume below the lowest tray in the array of vertically stacked trays. In FIG. 1, central carrier gas downtube 23 passes through a cylindrical collar of each tray that extends through the floor of the tray. In this example, there is included at the cylindrical collar next to downtube 23 a sealing O-ring 38 positioned between successive trays to ensure a leak-proof seal at the juncture of the downtube with the floor of the tray. An additional outer O-ring can also be utilized to seal between trays on the top surface of each tray sidewall. Each of the individual trays 22 has a floor and sidewall to form a tray cavity for placement and support of the source material. The trays are preferably fabricated of a non-reactive heat-conducting material, such as for example stainless steel, silver, silver alloy, copper, copper alloy, aluminum, aluminum alloy, lead, nickel clad, graphite, silicon carbide coated graphite, boron nitride, ceramic material, and combinations, mixtures and composites of two or more of the foregoing.

Referring again to FIG. 1, the vertically stacked trays are provided with a plurality of protuberances or through-tubes 30 through which the carrier gas flows. The trays hold a solid precursor material for volatilization upon heating thereof. The heating may be carried out with thermal energy being inputted to the vessel body to conductively heat the trays mounted in the vessel body so that the precursor material disposed in the trays is heated sufficiently to volatilize the precursor material. The volatilized precursor then is entrained in the carrier gas flowed through the interior volume of the vaporizer vessel and carried out of the vessel body via outlet 40 in such carrier gas in the dispensing operation. Additionally, or alternatively, to the heating of vaporizer vessel 10 with thermal energy input, the carrier gas itself may be heated to an appropriate temperature to effect or assist in the volatilization of the precursor material within the trays when the carrier gas is contacted with the precursor material.

Even with the various configurations offered in the prior art to facilitate even and continuous sublimation of precursor materials for semiconductor processing, semiconductor component manufacturers are facing the challenges of increasing semiconductor component processing throughput and improving semiconductor component yields while dealing with rapidly changing semiconductor component designs requiring more manufacturing flexibility from current semiconductor manufacturing installations. One area that can improve the overall installed base of semiconductor processing is providing flexibility in vaporizer vessel designs that can be fitted into new installations or retrofitted into current installations to address some of these manufacturing challenges. In some cases, the installed based may need a smaller overall vaporizer vessel, while another may need quicker access to the various support trays to replenish or replace precursor material. Providing a customizable or configurable vaporizer vessel that can be performed onsite would be a substantial advantage to the semiconductor manufacturer and advancement in the prior art.

Figure 2:
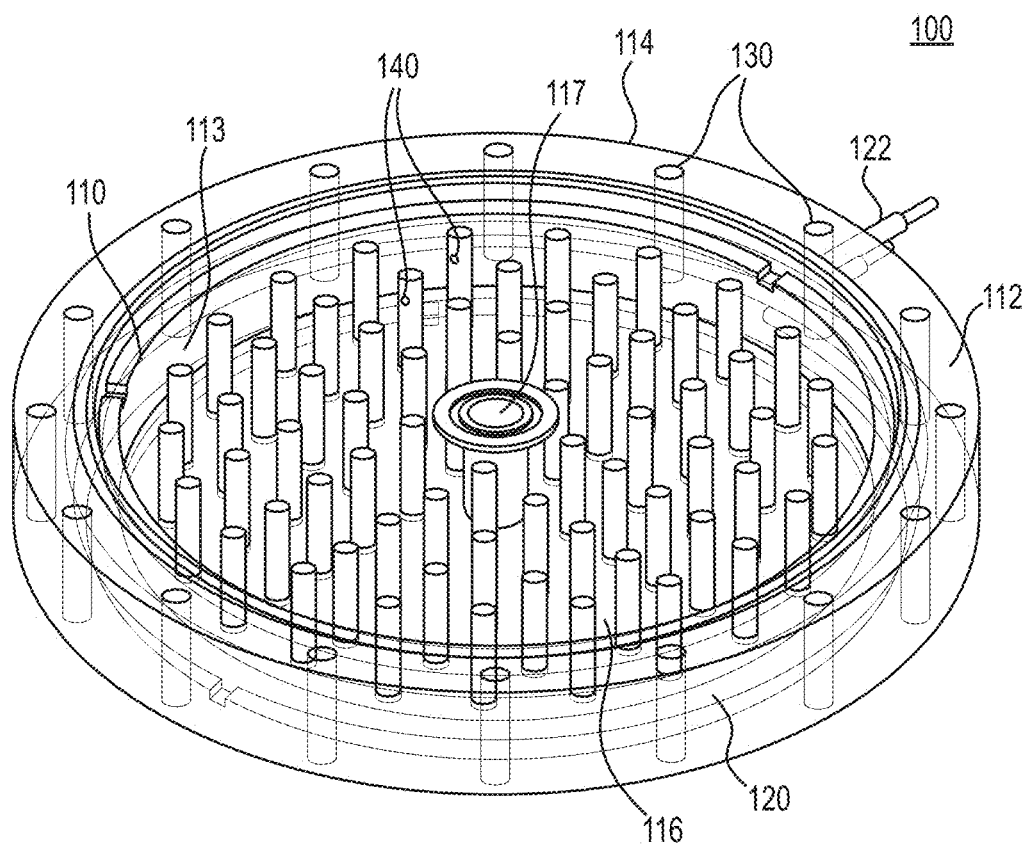
FIG. 2 illustrates a metallic tray module assembly including a support tray component with an integrated heater member or integrated heating system according to an example embodiment of the invention.

Referring now to one or more of the various embodiments of the invention that solve one or more of these challenges for the semiconductor manufacturer, there is provided a readily configurable and customizable vaporizer vessel assembly using a unique support tray with its own heating system that serves as a building block for the vaporizer vessel used in the factory installation. The individual support tray module will facilitate the configuration of various types of vaporizer vessels while speeding up the maintenance and/or precursor change out process. Referring now to FIG. 2 there is illustrated a metallic tray module assembly 100 that includes a support tray component 110 with an integrated heater member or integrated heating system 120 according to an example embodiment of the invention. In one example embodiment, the FIG. 2 illustrates metallic tray module assembly 110 with cast-in heater members 120 in an individual support tray 110, thereby eliminating the need for a custom heating jacket for each vaporizer or ampoule as in standard ampoule designs. In this example embodiment, support tray 110 is bounded by an upwardly extending sidewall 112, the tray sidewall having an interior sidewall surface 113 and an exterior sidewall surface 114. Heater member 120 is disposed in between interior sidewall surface 113 and exterior sidewall surface 114 of support tray sidewall 112, the heater member including a connecting member 122 protruding from exterior sidewall surface 114 of support tray 110. In this example embodiment, heater member 120 is comprised of a resistive heating element and control system, wherein heater member 120 is a coated conductor or metal cable that is continuously disposed about the entire periphery of tray module 110 and between interior sidewall surface 113 and exterior sidewall surface 114 of sidewall 112 and includes connecting member 122 that is coupled to the control system that controls that current flow through the conductive element. In this example embodiment, sidewall 112 includes part of a module locking mechanism (channels) 130 for holding various support trays 110 together to form the ampoule as a bolt is fed through a lid member from the top through one or more support trays 110 through channels 130 through to a base member. Alignment and tray module locking mechanism 130 is disposed about the periphery of the heater member and inset from exterior sidewall surface 114.

In another example embodiment, heater member 120 includes a system of intermittently disposed heating elements located about the entire periphery of tray module 110 and within sidewall 112. In yet another example embodiment, the heater member includes a conduit, which is either formed or cast within sidewall 112 or is a plastic or copper conduit or tubing the is formed within sidewall 112, for circulating heated water or steam through a fluid connecting member and/or valve. The tray module assembly of claim 1, wherein the support tray is formed in a substantially square configuration and the sidewall is a substantially square configuration.

Figure 3:
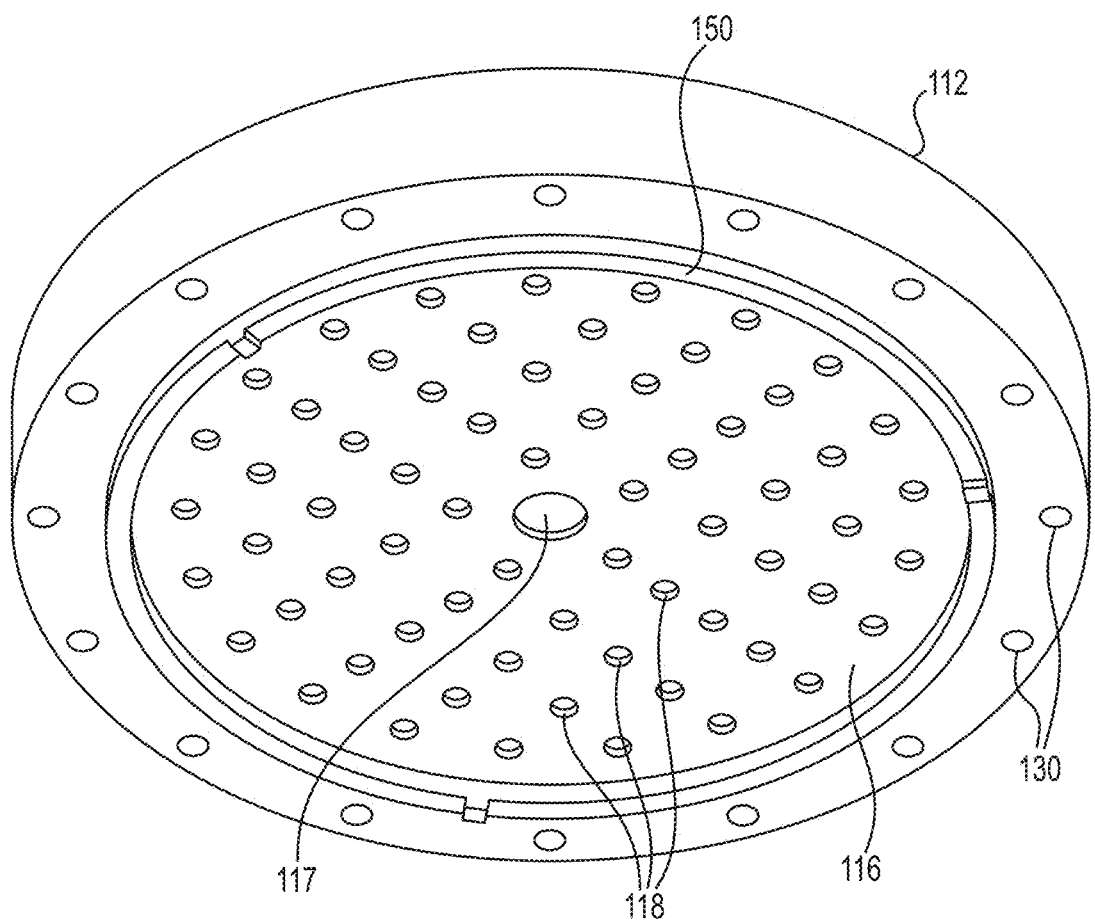
FIG. 3 illustrates a bottom view of a support tray component of the tray module assembly with a locking poke-yoke or fitted design for ease of assembly of the ampoule assembly according to an example embodiment of the invention.

Referring now to FIGS. 2 and 3, in this example embodiment, support tray 110 includes a floor panel 116 that supports the precursor material and includes a plurality of holes 118 to facilitate the carrier gas to flow up through the various tray modules in the ampoule. Tray 110 also includes a central opening 117 for channeling the carrier gas through one or more support tray 110 in an assembled ampoule. Support tray 110 of tray module 100 further includes a plurality of through-tubes 140 providing a passageway for movement of the carrier gas through each through-tube 140. The through-tubes in various embodiments extend upwardly from floor 116 of the support tray and define a central passageway communicating with a corresponding opening or hole 118 in tray floor 116. In other embodiments, through-tubes 140 extend upwardly from floor 116 of the tray in the same manner, but also extend downwardly below tray 110, so that the central passageway is enclosed by the through-tube, e.g., as a central bore thereof, both above and below the floor of the tray. The through-tubes can have any shape or configuration that provides for flow of gas therethrough, such as being cylindrical or conical in shape.

The through-tubes can be secured to the floor of the tray in any suitable matter, e.g., by welding, brazing, mechanical fastener attachment, press-fit, swaging, etc. In the alternative, the through-tubes can be integrally formed as part of the tray floor. In a specific embodiment, the height of each of the through-tubes is approximately the same height as that of the tray sidewall, although other embodiments are contemplated, in which the height of each of the through-tubes is greater or less than such sidewall. The side walls of the respective trays may be of sufficient height, so that the trays are stackable to form a vertically extending stacked array in the interior volume of the vessel of the vaporizer. In another embodiment, the trays may be fabricated with sidewalls that are only of sufficient dimensional extent as to allow mounting or fixation to the interior wall surface of the vaporizer vessel.

Referring again to FIG. 3, a bottom view of support tray component 110 of tray module assembly 100 illustrates a locking poke-yoke or fitted design for ease of assembly of the ampoule assembly according to an example embodiment of the invention. In particular, a bottom surface of support tray 110 includes a downwardly extending ring member 150 for facilitating the mating of each support tray module 100 that is placed on an open end of a second support tray module (see FIG. 4). In a related embodiment, ring member 150 forms part of tray module sidewall 112 that extends below support tray module 100 to engage either a base member or engage a top of another tray module member in an airtight mating configuration. In one example embodiment, sidewall 112 is configured to extend above tray module 100 to receive either a lid member or engage a bottom of another tray module member in an airtight mating configuration that forms a vapor delivery vessel assembly, such as ampoule 200 (see FIG. 4).

Figure 4:
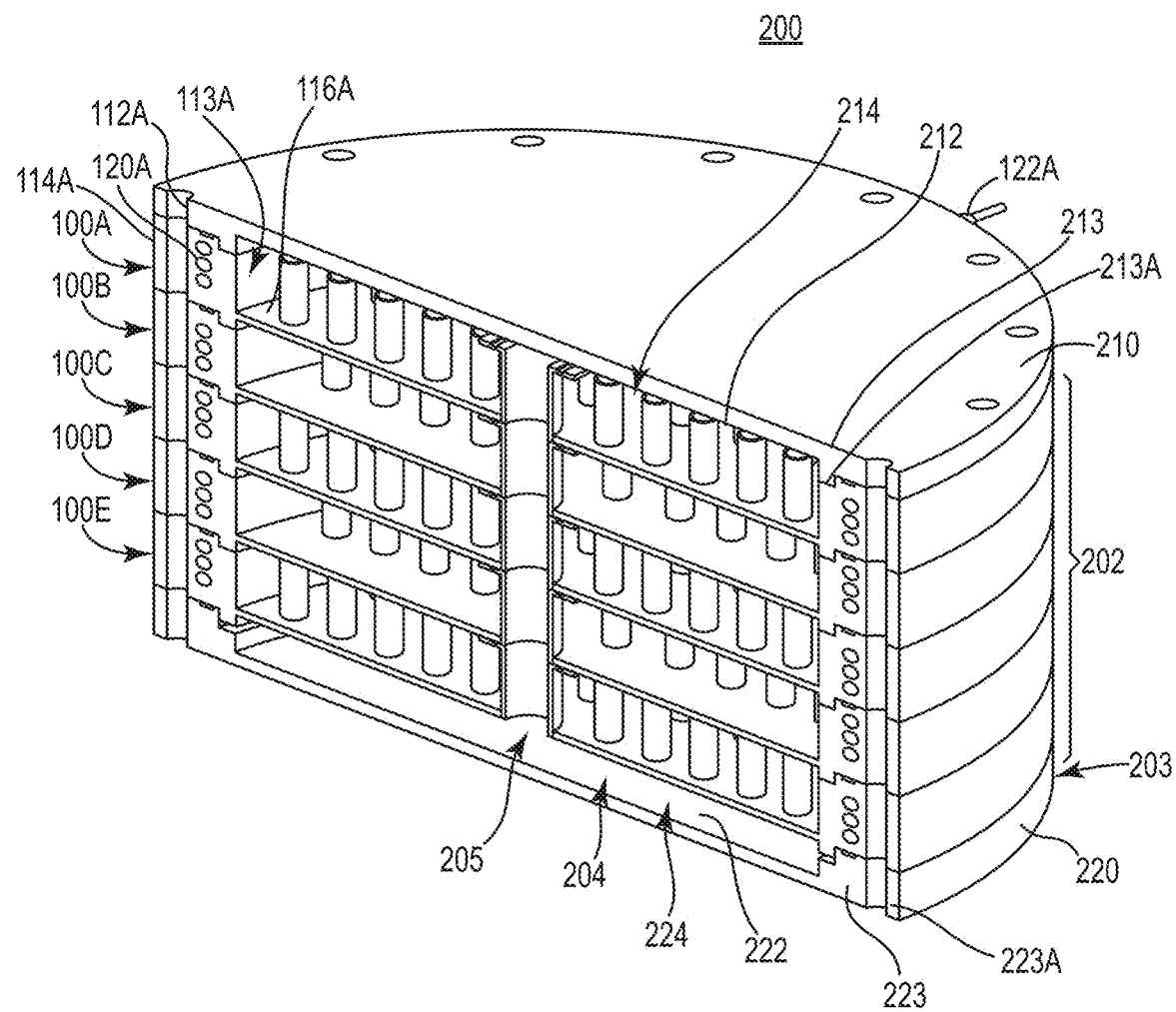
FIG. 4 illustrates a fully assembled modular ampoule assembly or vapor delivery vessel assembly for vaporizing and delivering vaporized source material which includes a plurality of support trays and a blank lid member and base member according to an example embodiment of the invention.

FIG. 4 illustrates a fully assembled modular ampoule assembly or vapor delivery vessel assembly 200 for vaporizing and delivering vaporized source material according to an example embodiment of the invention. In this example embodiment, ampoule assembly 200 includes a configurable vessel body 202 formed from a plurality of support tray modules 100A-100E which are assembled between a blank configurable lid member 210 and a base member 220. The novel ampoule assembly design provides a user a kit for assembling an ampoule for a particular application using one or more tray modules described herein and the lid and base members to "build" an ampoule. This approach advantageously eliminates the need (and the component cost) for the prior separate ampoule body that normally holds the support trays and that was used to heat each of the support trays by thermal conduction from the ampoule body through to each of the support trays. Issues with evenly distributed heating among the support trays is now also eliminated as each tray module has its own individual heater member that can be coupled (in series or in parallel) to a heat control system. The base member and a lid member, each of which can have concave interiors, can also be designed to fit with one or more of the interposed tray modules (and if need be, with their own individual heater members) to form a standalone operable ampoule.

In this example embodiment, ampoule vessel 200 is shown without a carrier gas inlet and a mixed gas outlet (as in FIG. 1) to illustrate the flexibility provided by vessel 200 in placement of the inlet and outlet valves desired by the user. Ampoule vessel 200 has a modular body 202 with an interior volume 204 defined by base member 220, lid member 210 and the plurality of tray modules 100A-100E that are interposed in between the base and lid in a stacked configuration, with the base member and the lid member securing the plurality of tray modules in the stacked configuration. Although not shown, a gas inlet and a gas outlet can be arranged in fluid communication with interior volume 204 of modular vessel body 202, the gas inlet being adapted to supply a first gas via a center channel 205 to interior volume 204 of vessel 200. As described above in connection with FIGS. 2 and 3, each of tray modules 100A-100E has a sidewall with an interior sidewall surface and an exterior sidewall surface, the stacked plurality of tray modules defining an interior diameter of modular vessel body 202 and defining an exterior vessel body surface 203 bounded by base member 220 and lid member 210. Base member 220 includes a base floor 222 and a base sidewall 223 located at a periphery of the base member both of which define a concave portion 224 inset from sidewall 223. As illustrated base sidewall 223 also includes a support surface 223A to support thereon supports at least one tray module 100E in a concentric configuration.

By way of example, tray module 100E also includes a sidewall with a sidewall support surface, which is inset from the external sidewall surface of tray module 100E, that supports thereon a second tray module 100D thereon in a concentric configuration. In this example embodiment, the vapor delivery vessel of claim 12 wherein the base sidewall includes a groove or channel on an upper end of the base sidewall adapted to receive an O-ring member therein, the O-ring and channel combination adapted to mate and form an air tight seal with the adjacent at least one tray module.

In this example embodiment, lid member 210 includes a lid panel 212 and a sidewall 213 extending downwards and located at a periphery of the lid member and defining a concave portion 214 inset from lid sidewall 213, the lid member being supported by at least one tray module, such as tray module 100A at a lid sidewall surface 213A in a concentric configuration. Tray module 100A, by way of example, includes a groove or channel on an upper end of tray module sidewall 112A that is configured to receive an O-ring member therein, the O-ring and channel combination mating and forming an air tight seal with the adjacent lid member 210 and adjacent tray module 100B. An internal portion of tray sidewall 112A of support tray module 100A is configured to extend below the tray module floor 116A to engage either a base member or engage a top of another tray module member in an airtight mating configuration. In one example embodiment, sidewall 112 is configured to extend above tray module 100 to receive either a lid member or engage a bottom of another tray module member in an airtight mating configuration that forms a vapor delivery vessel assembly, such as ampoule 200. Lid member 210 is then secured by bolt mechanical fasteners through the ampoule body and base member to form the ampoule assembly 200.

By way of example, tray module 100A includes a heater member 120A disposed between an interior sidewall surface 113A and an exterior sidewall surface 114A of the tray module, with heater member 120A including a connecting member 122A extending external to the exterior of the vessel body surface 202. Heater member 120A is disposed substantially about the entire periphery of tray module 100A and in this example embodiment the heater member is comprised of a resistive heating element that is coupled to a heater control system. In a related embodiment, heater member 120A includes a conduit for circulating heated water or steam through a connecting member, such as a water or steam valve, to heat the precursor material contained within the tray module.

Figure 5:
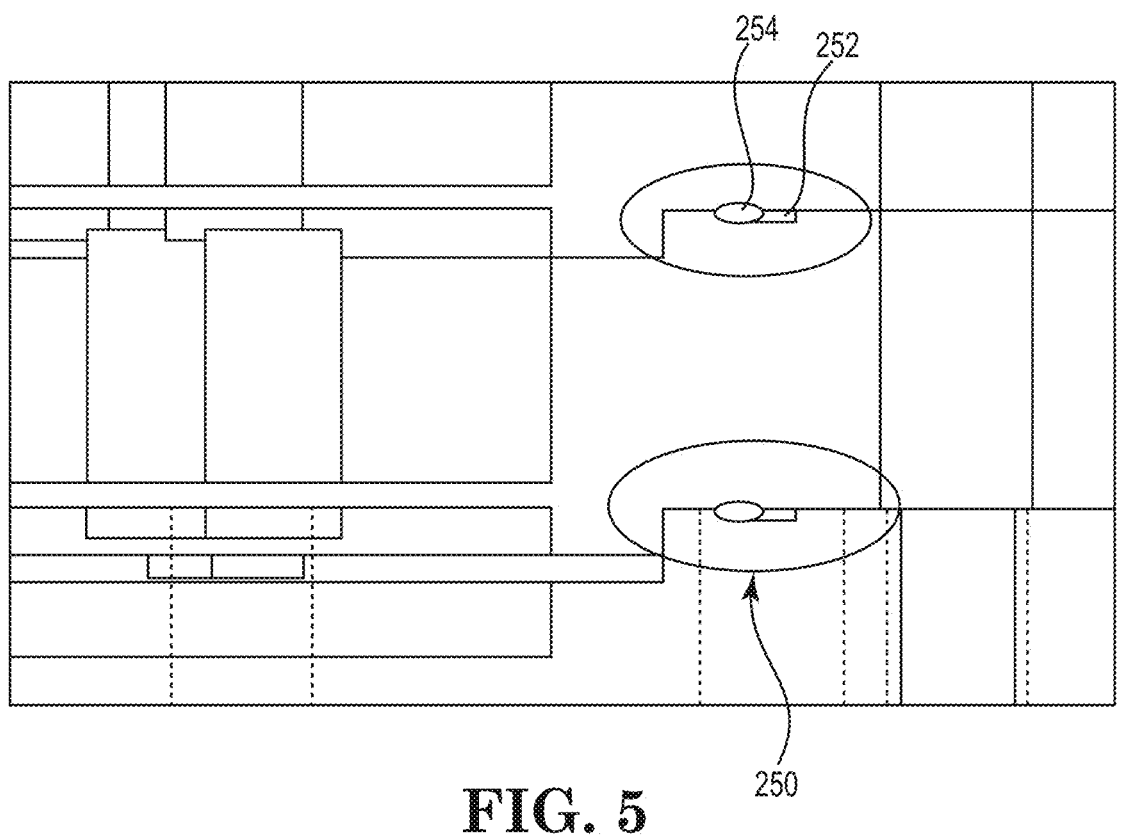
FIG. 5 illustrates a sealing arrangement integrated into the individual support trays which includes an O-ring groove and an O-ring disposed therein the combination of which is located between each support tray according to an example embodiment of the invention.

Referring now to FIGS. 4 and 5, there is illustrated a sealing arrangement 250 integrated into each of the individual support tray modules 100A-100E which includes an O-ring groove 252 and an O-ring 254 (a standard polymer or metal O-ring) disposed therein the combination of which is located between each support tray module thereby providing a tight seal. Tray module 100A, by way of example, includes a groove or channel on an upper end of tray module sidewall 112A that is configured to receive an O-ring member therein, the O-ring and channel combination mating and forming an air tight seal with the adjacent lid member 210 and adjacent tray module 100B.

In one example embodiment, each of the tray modules 100A-100E has a circumscribing sidewall, and the height of each through-tube 140 is less than the height of the tray module sidewall, thereby providing a head space above the end of the through-tube for gas dispersion and circulation within the respective tray module. Alternatively, the through-tubes and tray modules can be configured to create fluidized beds in each of the tray modules, or the tray modules can be fabricated with porous openings therein, so that solids or other source reagent material is initially supported on the top surface (or floor of the tray module) of the tray module, with the carrier gas being flowed through the through-tubes or porous openings, at sufficient superficial velocity to fluidize the source reagent. For such purpose, the source reagent preferably is in a powder or other finely divided solid form, so that the pressure drop associated with the fluidization is not excessive. In such arrangement, the dimensions of the through-tubes or porous openings may be sufficiently small as to retain the solids supported on the tray module in the absence of fluidizing gas flow. More generally, through-tubes 140 desirably have a height that provides a leak-proof region for placement of a sufficient quantity of source material, to provide the required vaporized material without leakage of solids or liquid into the underlying container through the open passageways of the through-tubes. In one example embodiment, each through-tube extends vertically upwardly from the bottom of the tray module to a height that can for example be in a range of from about 0.5 mm to about 5 mm, and more preferably in a range of from about 1.5 mm to about 3.0 mm.

In another example embodiment, the positioning of each of the through-tubes 140 in each tray module is slightly offset from the positions of the through-tubes in an adjacent tray module, thereby forcing the carrier gas to circulate within the tray module for contact of the carrier gas with the vaporized source material before the resulting gas mixture is transported through the through-tubes into the next-adjacent tray module internal volume or region. By such arrangement, the multiple levels of contacting of the carrier gas with the source reagent material permits the carrier gas to become saturated in a highly efficient manner.

The size of vaporizer delivery system 200 can be widely varied depending on the amount of the vapor to be supplied to the downstream fluid-utilizing installation, such as a CVD apparatus, plasma doping system, or ion implantation system. In one example embodiment, vaporizer or ampoule 200 has a cylindrical conformation with an inner diameter in a range of from about 3 to 6 inches, e.g., about 3.75 inches. The number of tray modules used in an ampoule assembly such as ampoule assembly 200 will be determined by the size of the vaporizer or ampoule desired by the user. In various embodiments, from three to five tray modules are coupled to form the ampoule assembly. Ampoule assembly 200 formed from individual tray modules 100A-100E, with individual heater members, can now be heated and kept at a more precise and desired temperature appropriate to the specific source material to be vaporized, the desired concentration of the source reagent in the carrier gas mixture that is delivered to the downstream fluid-utilizing facility from ampoule assembly 200, and the specific set of operating conditions that is utilized in the source reagent vaporization operation. Heating of each of the individual support tray modules can also be performed with a heat transfer fluid at elevated temperature flowing through channels or conduits formed within each tray module sidewalls so as to effect heating thereof. In another embodiment, steam or other preheated gases are directed through the conduit in the sidewalls of each tray module to assist the heating of the source reagent and vaporization thereof. In yet another related embodiment, ampoule assembly 200 is covered or encased in an insulated jacket to preserve and contain the heat, thereby reducing loss of heat to manufacturing surroundings and reducing energy consumption. In yet another example embodiment, each of the individual tray modules includes an insulative or reflective exterior coating to keep the heat within each tray module.

In a specific arrangement for vapor delivery from sublimable solid source reagents, the vaporizer delivery system of the present invention utilizes a series of individually heated trays. In a related embodiment, an ampoule assembly as described herein includes a plurality of heated through-tubes that increase the heated surface area, thereby enabling sublimation of solid source material to be achieved in a highly efficient manner as a result of the increased distribution of heat. At a given temperature, the vapor pressure of a solid is the partial pressure of that material at the solid/gas interface, that is, there are as many molecules condensing on the solid surface as the number of molecules sublimating from the surface at a given time period. Equilibrium is destroyed if the molecules in the gaseous state are removed from the solid/gas interface by the carrier gas. Sublimation takes place at a higher rate to restore equilibrium where there is enough heat supplied to the surface of the solid to compensate for the latent heat of sublimation of the solid. By providing a plurality of heated through-tubes on individually the entire configured ampoule assembly functions to increase the rate of sublimation so as to produce an increased flow rate of saturated carrier gas and reduce the precipitation of vaporized source material that can clog the through-tubes or other pores or channels of the trays.

The specific temperature of the vaporizer assembly that is utilized in a given application will depend on the operating conditions of the downstream fluid-utilizing apparatus, e.g., CVD apparatus or ion implantation system, and the vapor pressure and the amount of the source material that is provided. In various specific embodiments in which sublimable solid source reagents are utilized, vaporizer temperatures in a range of from about 20° C. to about 300° C. can be utilized. Implementations of the present invention involving metal halide solid source reagents can for example utilize temperatures in a range of from 200° C. to 300° C., in specific embodiments. The source reagent material may be in any suitable form, including solid form, liquid form, semi-solid form, or a solution containing the source reagent material dissolved or dispersed in a suitable solvent medium.

The vaporizer delivery system of the various embodiments disclosed herein can further comprise: flow circuitry components such as flow control valves, mass flow controllers, regulators, restricted flow orifice elements, thermocouples, pressure transducers, monitoring and control devices. In some embodiments of the invention, heating of source reagent vapor discharge lines is conducted to maintain the temperature of such lines 5-10° C. hotter than the vaporization temperature in order to prevent condensation in such discharge lines.

In one embodiment, the source reagent material is provided in the form of a deposit, coated on the surfaces of the trays and through-tubes within the tray cavity as a film or coating of suitable thickness. Such film or coating may be formed by any of various suitable methods, including the method of melting the source reagent by heating same, applying the molten source reagent material to the surfaces of the trays and through-tubes and then cooling the applied material. In another embodiment, wherein the source reagent comprises a metal complex, the metal complex can be dissolved in a solvent and the resulting solution applied to the surfaces of the trays and through-tubes, followed by removal of the solvent from the applied material under reduced pressure.

In some embodiments, it may be desirable to concurrently supply different source reagent vapor species from the vaporizer assembly to a downstream fluid-utilizing installation. In such applications, different source reagent materials can be provided on different tray modules. By such arrangement, it is possible to generate a multicomponent vapor that is carried by the carrier gas to the downstream facility. After assembly of the vaporizer ampoule assembly similar to assembly 200, and coupling of the vaporizer ampoule with process lines for delivery of carrier gas to the vessel, and discharge from the vessel of carrier gas mixture containing the source reagent vapor, each vaporizer heater tray module may be actuated to effect heating of the vaporizer assembly. The heating is conducted so that the internal temperature within the vaporizer assembly and contacting tray modules is increased to a temperature sufficient to vaporize the source material.

In the case of a sublimable solid, the sublimation rate will be greatest on the first or lowest tray module due to the pure carrier gas entering that tray module, as opposed to the partially or fully saturated carrier gas entering the tray modules above it. As such, it may be necessary to load more source reagent material on the bottom tray module and/or to increase the height dimension of the container to enable the desired amount of source reagent vapor to be generated and flowed to the downstream fluid-utilizing facility.

Vaporizer ampoule assembly 200 is advantageously utilized for generating vapor from a wide variety of source reagent materials, and has particular utility for volatilization of sublimable solids such as decaborane, hafnium tetrachloride, bis cyclopentadienyl magnesium, trimethylindium, and the like. The vaporizer may be utilized in various applications for volatilization of solid source materials, e.g., solid materials characterized by sublimation temperatures in a range of between about 20° C. to about 300° C. and vapor pressure in a range of from about $10^{-2}$ Torr to about $10^3$ Torr at its sublimation temperature. The amount of power required for complete vaporization is a function of the chemistry of the source material and carrier gas, and the flow rate of the mixture. In a specific embodiment, the thermal power transferred to the vaporizer assembly can be in a range of from about 100 W to about 3000 W to provide highly efficient isothermal temperatures for the source reagent vaporization.

Temperature may be controlled within vaporizer ampoule assembly 200 by the heating member regulating or control system and temperature within the vaporizer ampoule assembly can be sensed by a thermocouple, thermistor, or any other suitable temperature sensing junction or device arranged for contacting a surface of the thermally conductive tray modules. Such temperature sensing device can be operatively coupled with a central processing unit, such as a general-purpose programmable computer, programmable logic unit, microcontroller, etc., as arrange to receive temperature sensing signals from the temperature sensing device, and to responsively modulate the heater member of one or more tray modules to achieve a desired production of source reagent vapor for the specific application involved.

In one example embodiment, to determine when vaporizer assembly 200 is depleted of source material, a level sensor monitoring system can be utilized to determine the amount of source material on one or more tray modules in the interior volume of vaporizer assembly 200, such as an optical sensor communicatively connected to a reflective surface on the bottom surface of a tray module to provide a change in signal when the tray module is near empty or empty.

For operation of the vaporizer assembly 200, a solid source reagent material can be loaded into the tray modules in a dry box or glove box, to eliminate the reaction of the precursor with oxygen and moisture while the vaporization vessel or ampoule is unassembled. The ampoule assembly then is coupled with the feed and discharge lines for carrier gas ingress and vapor-containing carrier gas mixture discharge, in the process system. A carrier gas from a suitable gas source then is introduced into vaporizer assembly 200 in the carrier gas inlet, e.g., at a gas flow rate in a range of from 1 to 10,000 standard cubic centimeters per minute (sccm). In some embodiments, carrier gas flow rates of 100 sccm to 10,000 sccm (10 liters/minute) may be utilized. The carrier gas is transported into vaporizer assembly 200 at an appropriate pressure, and flows from the lower portion of the vessel, where it is introduced, outwardly and upwardly through the interior volume, through the successive trays and through-tubes thereof.

As the carrier gas flows upwardly through the different levels of the vertically stacked tray modules, the carrier gas becomes saturated with vaporized source reagent material. The resulting carrier gas mixture containing the source reagent vapor then flows out of vaporizer assembly 200 at the gas outlet valve to a process chamber or other gas-receiving facility or tool, in which the dispensed source reagent vapor-containing carrier gas mixture is processed or utilized. In various specific embodiments, such process chamber comprises an atomic layer deposition chamber or an ion implantation chamber.

Solids precursors with which the vaporizer can be usefully utilized are of any suitable type, including solid-phase metal halides, organometallic solids, and the like. Examples of source reagents that may be utilized in various applications include, without limitation, dimethyl hydrazine, trimethyl aluminum (TMA), trimethyl indium (TMI), bis cyclopentadienyl magnesium ($Cp_2Mg$), tris ethylcyclopentadienyl yttrium (($EtCp)_3Y$), hafnium chloride ($HfCl_4$), zirconium chloride ($ZrCl_4$), indium trichloride, aluminum trichloride, titanium tetraiodide, tungsten carbonyl, $Ba(DPM)_2$, bis di pivaloyl methanato strontium (Sr $(DPM)_2$), $TiO(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, precursors incorporating alkylamidinate ligands, organometallic precursors, zirconium tertiary butoxide (Zr (t-OBu)$_4$), tetrakisdiethylaminozirconium ($Zr(Net_2)_4$), tetrakisdiethylaminohafnium ($Hf(NEt_2)_4$), tetrakis (dimethylamino) titanium (TDMAT), tertbutyliminotris (deithylamino) tantalum (TBTDET), pentakis (demethylamino) tantalum (PDMAT), pentakis (ethylmethylamino) tantalum (PEMAT), tetrakisdimethylaminozirconium (Zr $(NMe_2)_4$), hafniumtertiarybutoxide ($Hf(tOBu)_4$), xenon difluoride ($XeF_2$), xenon tetrafluoride ($XeF_4$), xenon hexafluoride ($XeF_6$), and compatible combinations and mixtures of two or more of the foregoing.

Thus, in the ampoule assembly 200, as described above, the carrier gas is introduced from the top end where lid member 210 is located and flows through a downwardly extending feed tube to a base portion 220 of the ampoule assembly for subsequent distribution and upward flow through each tray module in the interior volume of the ampoule assembly. In such manner, the ampoule assembly, when heated, conductively heats the tray modules in the ampoule assembly interior volume, to produce vapor deriving from the source reagent on the tray modules. The generated vapor then is entrained in the carrier gas. The resulting carrier gas mixture including the source reagent vapor then is discharged from the vaporizer assembly at the top end thereof through an output port of the ampoule assembly having a discharge valve therein. For additional chemistries for sublimation, tray module configurations and ampoule, gas flows and ampoule assembly configurations, reference is made to U.S. Pat. No. 8,821,640 to Cleary et al, which is incorporated by reference in its entirety.

We have unexpectedly found that in a vaporizer assembly of a type as shown in FIG. 4, as utilized for low flow rate operation in dispensing of vapor by upflow of carrier through the respective tray modules, but susceptible to producing progressively more unsaturated carrier gas with increasing carrier gas flow rate, it is possible to substantially increase the saturation of carrier gas by reversing the flow of the carrier gas through the interior volume of the vaporizer assembly, so that it flows from top-to-bottom, rather than from bottom-to-top. This reversal of flow can be effected by changing the carrier gas supply line from coupling with the carrier gas inlet valve to coupling with the gas outlet valve, and concurrently changing the vaporizer assembly dispensing line from coupling with the gas outlet valve to coupling with the carrier gas inlet valve so that the former inlet becomes the discharge, and the former discharge becomes the carrier gas inlet, resulting in the desired top-to-bottom flow arrangement for the carrier gas. By this reversal of flow of the carrier gas to a top-to-bottom flow arrangement, the flow passages in the top tray module channel the carrier gas introduced at the upper end portion of the vaporizer vessel above such top tray module through the flow passages so that it directly contacts the solid source material on the next-lower tray module. This direct impingement of the carrier gas creates better contact of the carrier gas with the solid and increases both the contact time and turbulence tray module-to-tray module, and improves the saturation character of the carrier gas.

For additional chemistries for sublimation, tray module configurations, gas flows and ampoule assembly configurations, reference is made to WO 2015/164029 to Baum et al, published on Oct. 29, 2015 and entitled SOLID VAPORIZER which is incorporated by reference in its entirety.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

We claim:

1. A tray module assembly for use in a vapor delivery vessel assembly for vaporizing and delivering vaporized source material, the tray module assembly comprising:

- a support tray bounded by an upwardly extending tray sidewall, the tray sidewall having an interior sidewall surface and an exterior sidewall surface,
- a heating assembly disposed in between the interior sidewall surface and the exterior sidewall surface of the support tray sidewall, the heating assembly including a connecting member protruding from the exterior sidewall surface of the support tray, and
- a portion of a module locking mechanism disposed in between the interior sidewall surface and the exterior sidewall surface of the support tray sidewall.

2. The tray module assembly of claim 1, wherein the heating assembly includes a heater member intermittently disposed about the entire periphery of the tray module.

3. The tray module assembly of claim 1, wherein the heating assembly includes a heater member continuously disposed about the entire periphery of the tray module.

4. The tray module assembly of claim 1, wherein the heating assembly is comprised of a resistive heating element and system.

5. The tray module assembly of claim 1, wherein the heating assembly includes a conduit for circulating heated water or steam through the connecting member.

6. The tray module assembly of claim 1, wherein the support tray sidewall includes a groove or channel on an upper end of the support tray sidewall adapted to receive an O-ring member therein, the O-ring and channel combination adapted to mate and form an airtight seal with a concentrically disposed adjacent support tray.

7. The tray module assembly of claim 1, wherein a bottom surface of the support tray includes a downwardly extending ring member adapted to facilitating mating of the support tray module that is placed on an open end of a second support tray.

8. The tray module assembly of claim 1, wherein the sidewall of the support tray further comprises an alignment and tray module locking mechanism disposed about the periphery of the heating assembly and inset from the exterior sidewall surface.

9. The tray module assembly of claim 1, wherein the sidewall of the support tray is configured to extend below the support tray to receive a base member and the sidewall of the support tray is configured to extend above the support tray to receive a lid member in an airtight mating configuration that forms a vapor delivery vessel assembly.

10. A vapor delivery vessel assembly for vaporizing and delivering vaporized source material, the vessel delivery assembly comprising:

- a modular vessel body having an interior volume defined by a base member, a lid member and a plurality of tray modules interposed therebetween in a stacked configuration, the base member and the lid member adapted to secure the plurality of tray modules in the stacked configuration;
- a gas inlet and a gas outlet arranged in fluid communication with the interior volume of the modular vessel body, the gas inlet being adapted to supply a first gas to the interior volume of the vessel; and
- a module locking mechanism for holding the plurality of tray modules, the lid member, and the base member together,
- wherein each tray module has a sidewall with an interior sidewall surface and an exterior sidewall surface, the stacked plurality of tray modules defining an interior diameter of the modular vessel body and defining an exterior vessel body surface bounded by the base member and the lid member; and
- wherein at least one of the tray modules includes a heating assembly and a portion of the module locking mechanism disposed between the interior sidewall surface and the exterior sidewall surface of the tray module, the heat assembly including a connecting member extending external to the exterior of the vessel body surface.

11. The vapor delivery vessel of claim 10, wherein the base member includes a base sidewall located at a periphery of the base member and defining a concave portion inset therefrom, the base sidewall adapted to support at least one tray module thereon in a concentric configuration.

12. The vapor delivery vessel of claim 11, wherein the base sidewall includes a groove or channel on an upper end of the base sidewall adapted to receive an O-ring member therein, the O-ring and channel combination adapted to mate and form an air tight seal with the adjacent at least one tray module.

13. The vapor delivery vessel of claim 10, wherein the lid member includes a lid sidewall extending downwards and located at a periphery of the lid member and defining a concave portion inset from the lid sidewall, the lid member adapted to be supported by at least one tray module at the lid sidewall in a concentric configuration.

14. The vapor delivery vessel of claim 10, wherein the tray module includes a tray module sidewall located at a periphery of the tray module and defining a support surface thereon inset from the tray module sidewall, the tray module sidewall adapted to support at second tray module thereon in a concentric configuration.

15. The vapor delivery vessel of claim 14, wherein the at least one tray module sidewall includes a groove or channel on an upper end of the tray module sidewall adapted to receive an O-ring member therein, the O-ring and channel combination adapted to mate and form an air tight seal with the adjacent at least one tray module.

16. The vapor delivery vessel of claim 10, wherein the heating assembly includes a heater member disposed substantially about the entire periphery of the tray module.

17. The vapor delivery vessel of claim 16, wherein the heater member is comprised of a resistive heating element and system.

18. The vapor delivery vessel of claim 10, wherein the heating assembly includes a conduit for circulating heated water or steam through the connecting member.

19. The vapor delivery vessel of claim 10, wherein the tray module sidewall includes a conduit formed in between the interior sidewall surface and the exterior sidewall surface of the support tray sidewall.

20. A vapor delivery vessel assembly for vaporizing and delivering vaporized source material, the vessel delivery assembly comprising:
   a modular vessel body having an interior volume defined by a base member, a lid member and a plurality of tray modules interposed therebetween in a stacked configuration, the base member and the lid member adapted to secure the plurality of tray modules in the stacked configuration; and
   a gas inlet and a gas outlet arranged in fluid communication with the interior volume of the modular vessel body, the gas inlet being adapted to supply a first gas to the interior volume of the vessel;
   wherein each tray module has a sidewall with an interior sidewall surface and an exterior sidewall surface, the stacked plurality of tray modules defining an interior diameter of the modular vessel body and defining an exterior vessel body surface bounded by the base member and the lid member and
   wherein the vapor delivery vessel does not include a separate outer ampoule body configured to support the tray modules or a heating device surrounding the exterior of the vapor delivery vessel.

* * * * *